United States Patent
Lee

(10) Patent No.: US 7,843,053 B2
(45) Date of Patent: Nov. 30, 2010

(54) STACK PACKAGE MADE OF CHIP SCALE PACKAGES

(75) Inventor: Dong-Ho Lee, Kyunggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 154 days.

(21) Appl. No.: 12/338,905

(22) Filed: Dec. 18, 2008

(65) Prior Publication Data

US 2009/0108432 A1 Apr. 30, 2009

Related U.S. Application Data

(60) Continuation of application No. 11/536,611, filed on Sep. 28, 2006, now Pat. No. 7,479,408, and a division of application No. 10/750,979, filed on Jan. 2, 2004, now Pat. No. 7,190,061.

(51) Int. Cl.
*H01L 23/02* (2006.01)
*H01L 23/48* (2006.01)
*H01L 23/52* (2006.01)
*H01L 29/40* (2006.01)
*H01L 25/065* (2006.01)

(52) U.S. Cl. .................. 257/686; 257/678; 257/688; 257/780; 257/E25.013

(58) Field of Classification Search ............... 257/686, 257/678, 688, 780, E25.013
See application file for complete search history.

(56) References Cited

U.S. PATENT DOCUMENTS 5,798,564 A * 8/1998 Eng et al. ................ 257/686

| 6,180,881 | B1 | 1/2001 | Isaak |
| 6,252,298 | B1 | 6/2001 | Lee et al. |
| 6,376,769 | B1 | 4/2002 | Chung |
| 6,768,191 | B2 | 7/2004 | Wennemuth et al. |
| 6,784,530 | B2 | 8/2004 | Sugaya et al. |
| 6,867,501 | B2 | 3/2005 | Shibata |
| 6,876,074 | B2 | 4/2005 | Kim |
| 2002/0126459 | A1 | 9/2002 | Albert et al. |
| 2004/0057085 | A1 | 3/2004 | Maltseff et al. |
| 2004/0124518 | A1 | 7/2004 | Karnezos |
| 2004/0150107 | A1 | 8/2004 | Cha et al. |
| 2005/0051903 | A1 | 3/2005 | Ellsberry et al. |

FOREIGN PATENT DOCUMENTS

| JP | 2000-216327 | 8/2000 |
| KR | 2001-0011310 | 2/2001 |
| KR | 2001-0028845 | 4/2001 |

OTHER PUBLICATIONS

English language abstract of Japanese Publication No. 2000-216327.
English language abstract of Korean Publication No. 2001-0011310.
English language abstract of Korean Publication No. 2001-0028845.

* cited by examiner

*Primary Examiner*—Luan C Thai
(74) *Attorney, Agent, or Firm*—Muir Patent Consulting, PLLC

(57) ABSTRACT

A stack package of the present invention is made by stacking at least two area array type chip scale packages. Each chip scale package of an adjacent pair of chip scale packages is attached to the other in a manner that the ball land pads of the upper stacked chip scale package face in the opposite direction to those of the lower stacked chip scale package, and the circuit patterns of the upper stacked chip scale package are electrically connected to the those of the lower stacked chip scale package by, for example, connecting boards. Therefore, it is possible to stack not only fan-out type chip scale packages, but to also efficiently stack ordinary area array type chip scale packages.

20 Claims, 3 Drawing Sheets

STACK PACKAGE MADE OF CHIP SCALE PACKAGES

This application is a Continuation of U.S. patent application Ser. No. 11/536,611, filed on Sep. 28, 2006, now pending, which is a Divisional of U.S. patent application Ser. No. 10/750,979, filed on Jan. 2, 2004, issued Mar. 13, 2007 with the U.S. Pat. No. 7,190,061, which claims priority under 35 U.S.C. §119 from Korean Patent Application No. 2003-00281, filed on Jan. 3, 2003, in the Korean Intellectual Property Office, the entire contents of which are hereby incorporated by reference

BACKGROUND OF THE INVENTION

1. Field of the Invention

The present invention relates generally to semiconductor packages, and more particularly, to a stack package made of a plurality of area array type chip scale packages.

2. Description of the Prior Art

The miniaturization of semiconductor packages has progressed very rapidly during the past ten years in order to keep up with the miniaturization of electronic devices. This progression of miniaturization has been especially prevalent in the field of mobile electronic devices because of the wide spread usage of chip scale packages (CSP). However, chip scale packages have a disadvantage when compared with conventional lead frame type packages because of the difficulty in using them with package stacking technology.

Stack packages, which are made by stacking a plurality of packages, have been developed and widely used to increase the installation density of chips. The stack package is different from a multi chip package (MCP), which is made by installing a plurality of chips in a package. The multi chip package has advantages in package size and package installation convenience. However, productivity of the multi chip package can be low because often chips that have not been tested for their quality are used, and if even one of the installed chips is inferior in performance, the entire multi chip package becomes inferior. On the contrary, the productivity of the stack package is usually superior to that of the multi chip package because all of the packages used for the stack package are tested. Therefore, even though both methods are available, the stack package is the preferred method to enhance chip installation density because of its reliability.

Chip scale packages are generally area array type packages, which are more inappropriate for stacking than lead frame type packages. There has been much effort to develop chip scale packages suitable for package stacking. Three examples of chip scale packages suitable for the stack package are disclosed in FIG. 1-FIG. 3.

FIG. 1 shows a well-known conventional type stack package 600 made of a plurality of chip scale packages. Each stacked chip scale package is a fan-out type ball grid array package 610. As shown in FIG. 1, a semiconductor chip 611 is installed and electrically connected to a beam lead 622 on a circuit board 620. A plurality of solder balls 637 are positioned on the peripheral area of the circuit board 620 and are connected to the semiconductor chip 611 through the beam lead 622.

One problem with the chip scale package 610 disclosed in FIG. 1, is that it is difficult to standardize the arrangement of the solder balls 637, because the arrangement of the solder balls 637 must be designed according to the size of the installed chip. For example, a 512 Mb DRAM chip cannot be installed in a package designed for a 256 Mb DRAM chip. This severely limits the versatility of this type of chip scale package stack.

FIG. 2 shows another conventional type stack package 700. Referring to FIG. 2, each stacked chip scale package 710 is made by attaching a chip 711 to a carrier tape 720 by beam lead bonding. The outer leads 737 of the stacked chip scale packages 710 are electrically connected to each other. In this kind of stack package, it is difficult to standardize each stacked package because the length of the outer leads 737 of each stacked package varies according to the stacked level. This non-standardization of lead parts results in production cost increases.

FIG. 3 shows a further conventional type stack package 800. Referring to FIG. 3, the stack package 800 comprises a plurality of fan-out type chip scale packages 810 and a conventional ball grid array (BGA) type chip scale package 805. The BGA type chip scale package 805 is stacked at the lowest level. The solder balls 837 are formed on the entire area of the BGA type chip scale package, and function as Input/Output ports of the stack package 800. This kind of stack package has the same technical drawback, i.e. the difficulty of standardizing the solder ball arrangement, as that of the stack package 600.

SUMMARY OF THE INVENTION

A stack package according an embodiment of the present invention comprises at least two area array type chip scale packages. Each chip scale package has a substrate, a plurality of ball land pads formed on a lower surface of the substrate, a plurality of circuit patterns formed on the lower surface of the substrate and electrically connected to the ball land pads, and at least one chip installed on the upper surface of the substrate and electrically connected to the circuit patterns.

Embodiments of the present invention direct the stacked chip scale packages to be attached to one another by orienting the ball land pads of the upper stacked chip scale package so that they face in the opposite direction of those of the lower stacked chip scale package. In addition, the circuit patterns of the upper stacked chip scale package are electrically connected to those of the lower stacked chip size package by connecting boards.

Furthermore, a hole may be formed on the substrate of each chip scale package, to allow the chip to be electrically connected to the circuit patterns by bonding wires passing through the hole.

Additionally, the chip may be protected by a first encapsulating part, and the bonding pads and the bonding wires may be protected by a second encapsulating part.

When an odd number of chip scale packages need to be stacked, a single chip scale package can be stacked on and electrically connected to adjacently stacked chip packages through a plurality of solder balls.

When an even number of chip scale packages needs to be stacked, adjacently stacked chip scale packages coupled by the connecting boards may be stacked on, and electrically connected through a plurality of solder balls to the other adjacently stacked chip scale packages.

A plurality of connection pads may be further formed on the region of each substrate on which the plurality of ball land pads are formed, and electrically connected to the circuit patterns. The connecting boards may then be attached to the connection pads so that they may be electrically connected to the circuit patterns through the connection pads.

Also, each chip scale package of an adjacent pair of chip scale packages may be attached to the other by an adhesive applied on the first encapsulating part or each package.

BRIEF DESCRIPTION OF THE DRAWINGS

The above features and advantages of the present invention will become more apparent by describing in detail an exemplary embodiment thereof with reference to the attached drawings, in which.

DETAILED DESCRIPTION OF EXEMPLARY EMBODIMENT

Figure 1:
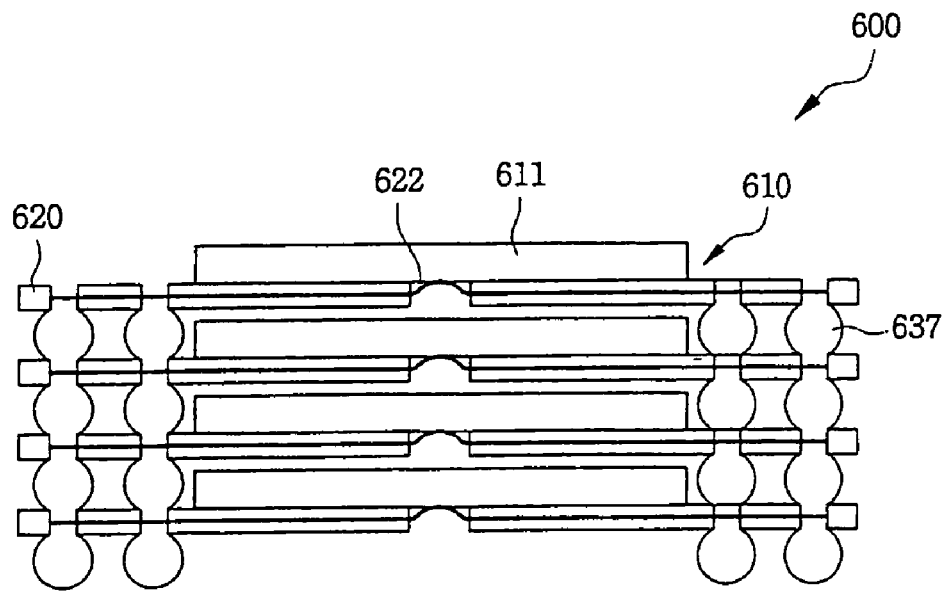
FIG. 1 is a conventional stack package made of a plurality of chip scale packages.
Figure 2:
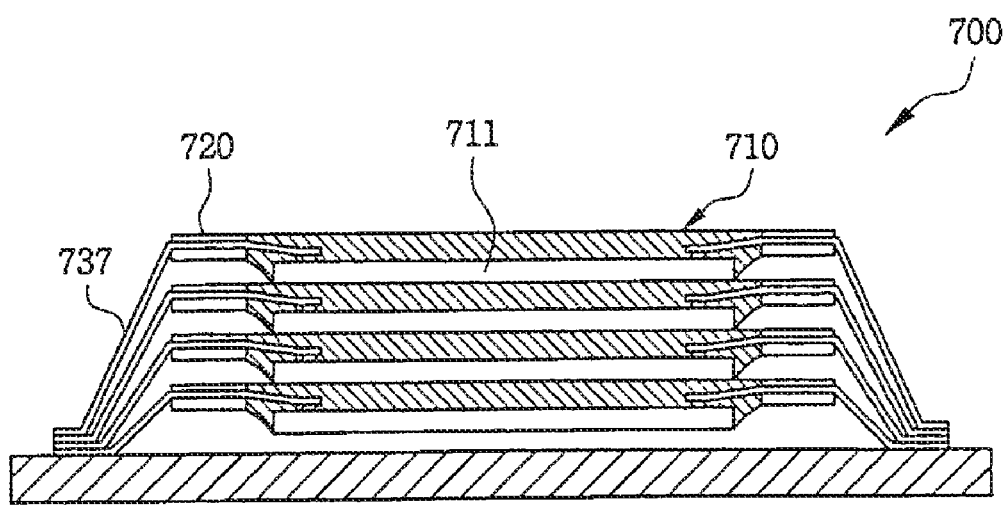
FIG. 2 is another type of conventional stack package made of a plurality of chip scale packages.
Figure 3:
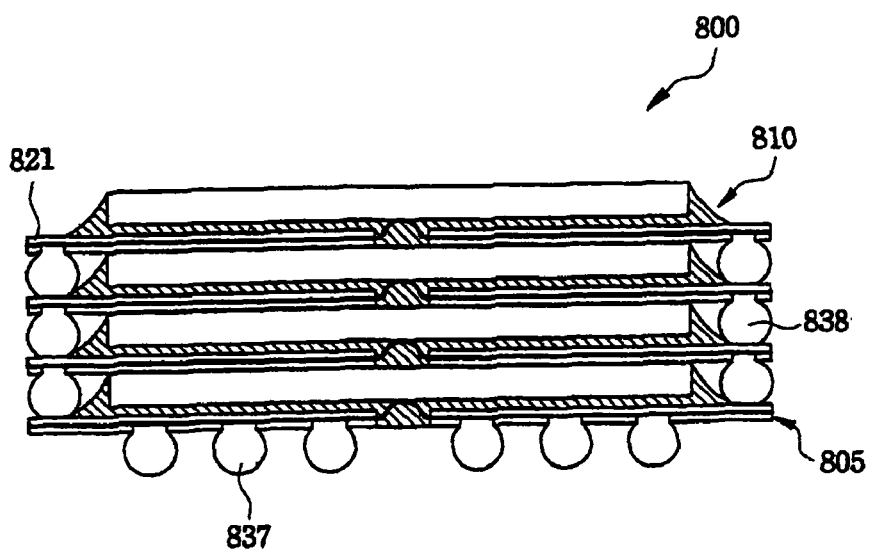
FIG. 3 is a further type of conventional stack package made of a plurality of chip scale packages.

The present invention will now be described more fully with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the shape of elements is exaggerated for clarity, and the same reference numerals in different drawings represent the same element.

Figure 4:
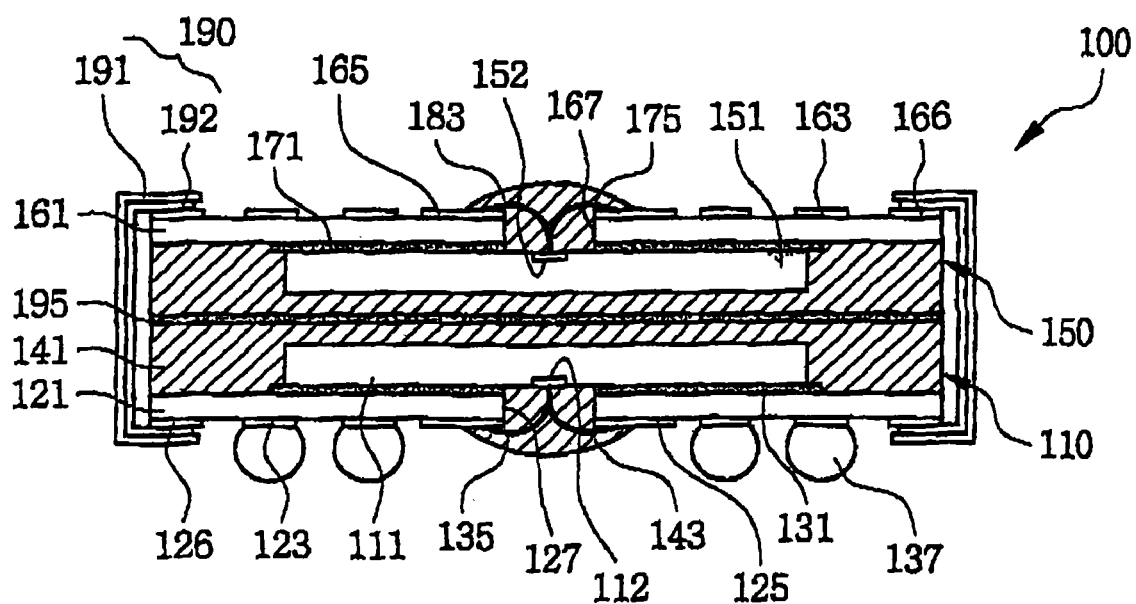
FIG. 4 is a stack package according to an embodiment of the present invention.

An embodiment of the present invention is disclosed in FIG. 4. Referring to FIG. 4, the stack package 100 comprises two chip scale packages 110, 150. The two chip scale packages 110, 150 are ordinary area array type packages and have the same structure, except that a plurality of solder balls 137 are formed only on the lower stacked chip scale package 110. The two chip scale packages 110, 150 are stacked in a manner that the ball land pads 163 of the upper stacked chip scale package 150 face in the opposite direction to the ball land pads 123 of the lower stacked chip scale package 110.

The lower stacked chip scale package 110 will be described referring to FIG. 4. The lower stacked chip scale package 110 is a conventional ball grid array (BGA) type package. A printed circuit board (PCB) or a tape circuit board may be used as a substrate 121 of the chip scale package 110. A plurality of ball land pads 123 are formed and electrically connected to circuit patterns 125 on the lower surface of the substrate 121. A plurality of solder balls 137 may be formed on the ball land pads 123 and function as I/O ports of the stack package 100. A semiconductor chip 111 is attached to the upper surface of the substrate 121 by an adhesive 131, and electrically connected to the circuit patterns 125.

A plurality of bonding pads 112 of the semiconductor chip 111 are electrically connected to the circuit patterns 125 by bonding wires 135 passing through a hole 127 formed in the central area of the substrate 121. In this embodiment, a center pad type semiconductor chip 111, which has bonding pads formed on the central region of the chip, is preferred. The semiconductor chip 111 is protected by the first encapsulating part 141, and the bonding wires 135, bonding pads 112 and circuit patterns 125 are protected by the second encapsulating part 143.

The upper stacked chip scale package 150 has the same structure as the lower stacked chip scale package 110 except that solder balls are not formed on the ball land pads 163. That is to say, the upper stacked chip scale package 150 is a land grid array type package.

On the substrates 121, 161 of the two stacked chip size packages 110, 150, connection pads 126, 166, electrically connected to the circuit patterns 125, 165, are formed outside of the area in which the ball land pads 123, 163 are formed.

The two chip scale packages 110, 150 are stacked in a manner that the ball land pads 123, 163 of each chip scale package face in opposite directions. This allows the first encapsulating parts 141, 181 of the two chip scale packages 110, 150 to be attached to each other by an adhesive layer 195.

The connection pads 166 of the upper chip scale package 150 are electrically connected to the connection pads 126 of the lower chip scale package 110 by flexible circuit boards 190. Each flexible circuit board 190 comprises a base film 191 and wiring patterns 192 formed on the base film 191. The flexible circuit boards 190 are attached to the sides of the stack package 100, and the ends of the flexible circuit boards 190 may be electrically connected to the connection pads 126, 166 by tape automated bonding (TAB). Preferably, each end of the flexible circuit boards 190 is folded to increase the connecting area between the circuit boards 190 and the connection pads 126, 166.

Although the flexible circuit boards are used in this embodiment for electrically connecting the connection pads 126, 166, it is possible to make an electrical connection between the connection pads 126, 166 by other methods, such as via holes filled with conductive materials.

As described in this embodiment, the chip scale packages 110, 150 used for the stack package 100 have ordinary area array structures. Strictly speaking, the matrix of ball land pads 163 of the upper chip scale package 150 is the same as that of the lower chip scale package 110. Additionally, each chip scale package can be tested for its functional reliability. Therefore, the reliability of the stack chip package can be improved by using tested chip scale packages. Further, an addition of a new chip scale package to the stack package is easily accommodated because each chip scale package used for the stack package is standardized.

Additions of chip scale packages to the stack package will be described referring to FIG. 5 and FIG. 6.

Figure 5:
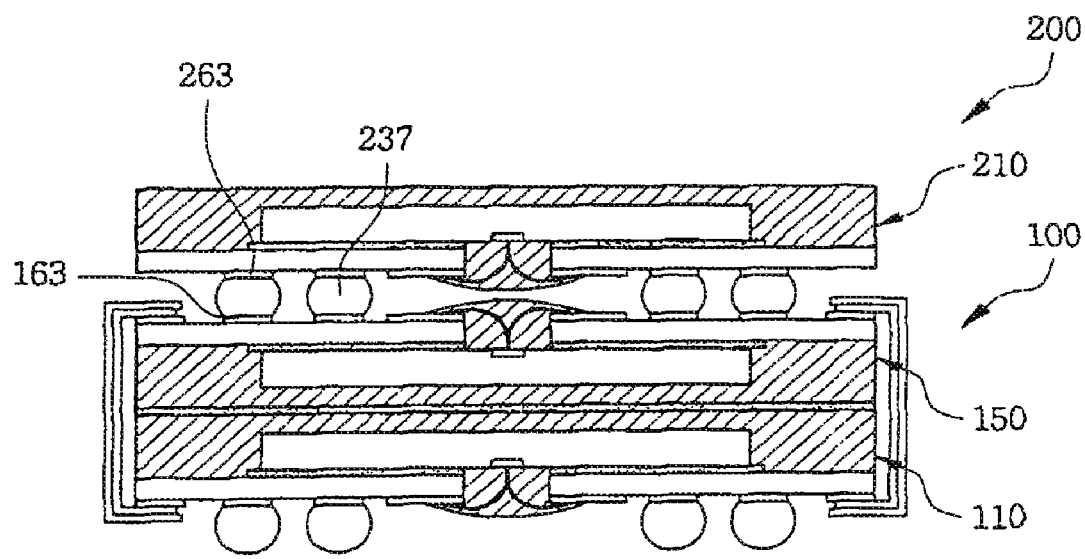
FIG. 5 is a stack package according to another embodiment of the present invention.

FIG. 5 shows another embodiment of the present invention, in which another chip scale package 210 is added to the stack package 100 disclosed previously in FIG. 4. This addition results in the stack package 200 now including three chip size packages 110, 150, and 210. Referring to FIG. 5, the ball land pads 263 of the highest stacked chip scale package 210 are electrically connected to the ball land pads 163 of the middle stacked chip scale package 150 by a plurality of solder balls 237.

Figure 6:
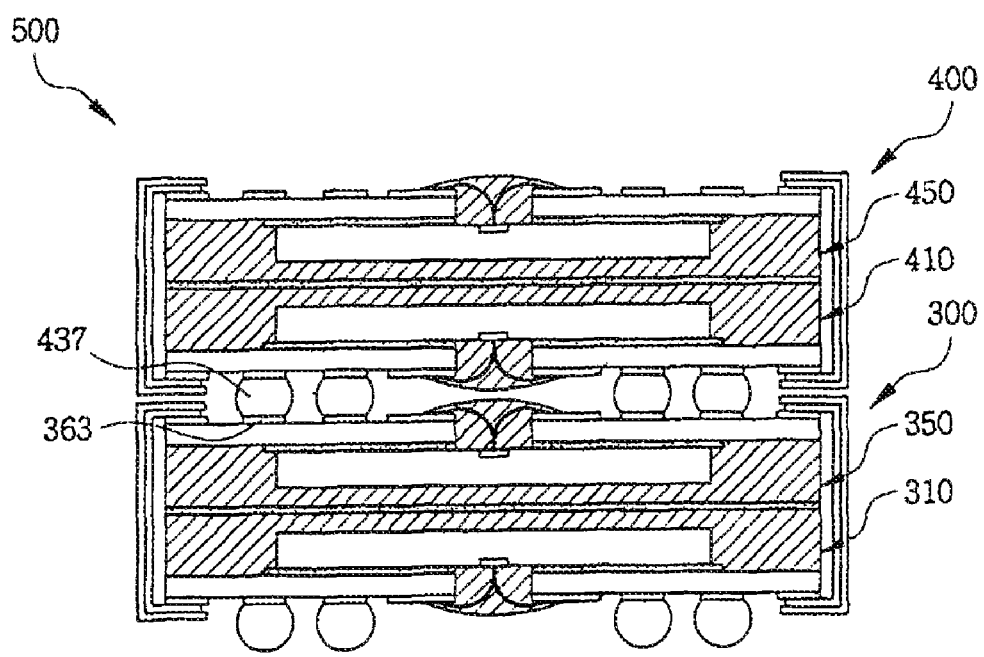
FIG. 6 is a stack package according to yet another embodiment of the present invention.

FIG. 6 shows yet another embodiment of the present invention, in which the stack package 500 comprises two of the stack packages disclosed in FIG. 4. This results in the stack package 500 now including four chip size packages 310, 350, 410, and 450. Referring to FIG. 6, chip scale packages 310, 350 are stacked to form a lower stack package 300, and chip scale packages 410, 450 are also stacked to form an upper stack package 400 by the previously described method in FIG. 4. Next, the upper stack package 400 is stacked on and electrically connected to the lower stack package 300 by an electrical connection between the ball land pads 463 of the chip scale package 410 and the ball land pads 363 of the chip scale package 350 through a plurality of solder balls 437.

By using the structure of stack packages disclosed in the embodiments, any desired number of ordinary area array type chip scale packages can be stacked. Further, because of the standardized structure of the chip scale package stacks, the production costs of the components used in forming these stacks can be reduced.

Although certain embodiments of the present invention have been shown and described in detail, it should be understood that various changes and modifications may be made therein without departing from the spirit and scope of the appended claims.

What is claimed is:

1. A stack package including two or more area array type chip scale packages comprising:
    a lower chip scale package of an adjacent pair of chip scale packages, the lower chip scale package comprising a substrate, a plurality of ball land pads formed on a first surface of the substrate, circuit patterns terminating in a plurality of connecting pads formed outside an area in which the plurality of ball land pads are formed, wherein the circuit patterns and the plurality of connecting pads are formed on the first surface of the substrate and are electrically connected to the plurality of ball land pads, and a chip installed on a second surface of the substrate and electrically connected to the circuit patterns, wherein the second surface is opposite the first surface; and
    an upper chip scale package of the adjacent pair of chip scale packages, the upper chip scale package comprising a substrate, a plurality of ball land pads formed on a first surface of the substrate, circuit patterns terminating in a plurality of connecting pads formed outside an area in which the plurality of ball land pads are formed, wherein the circuit patterns and the plurality of connecting pads are formed on the first surface of the substrate and are electrically connected to the plurality of ball land pads, and a chip installed on a second surface of the substrate and electrically connected to the circuit patterns, wherein the second surface is opposite the first surface,
    wherein the upper chip scale package is stacked on the lower chip scale package so that the ball land pads of the upper chip scale package face a direction opposite that of the ball land pads of the lower chip scale package, and wherein the circuit patterns of the upper chip scale package are electrically connected to the circuit patterns of the lower chip scale package.

2. The stack package of claim 1, wherein the circuit patterns of the upper chip scale package are electrically connected to the circuit patterns of the lower chip scale package by one or more connecting boards comprising a flexible film, wherein conductive patterns are formed on the film and electrically connect the connection pads of the upper chip scale package to the connection pads of the lower chip scale package.

3. The stack package of claim 2, wherein both ends of the connecting board at which the connecting board is attached to the connection pads are bent.

4. The stack package of claim 1, wherein areas of the ball land pads of the upper chip scale package and areas of the ball land pads of the lower chip scale package are substantially identical in size.

5. The stack package of claim 1, wherein, for each of the adjacent pair of chip scale packages, a hole is formed in the substrate and the chip is electrically connected to the circuit patterns by bonding wires through the hole.

6. The stack package of claim 5, wherein, for each of the adjacent pair of chip scale packages, a plurality of bonding pads are formed on a central region of the chip and exposed through the hole, and wherein one end of each bonding wire is attached to a corresponding bonding pad of the chip.

7. The stack package according to claim 6, wherein, for each of the adjacent pair of chip scale packages, the chip is protected by a first encapsulating part, and the bonding pads and bonding wires are protected by a second encapsulating part.

8. The stack package according to 7, wherein one of the adjacent pair of chip scale packages is attached to the other by an adhesive applied on the first encapsulating part.

9. The stack package according to claim 1, wherein a plurality of solder balls is formed on the plurality of ball land pads of the lower chip scale package.

10. The stack package according to claim 1, wherein a single chip scale package is stacked on and electrically connected through a plurality of solder balls to adjacently stacked chip scale packages coupled by connecting boards.

11. The stack package according to claim 1, wherein adjacently stacked chip scale packages coupled by connecting boards are stacked on and electrically connected through a plurality of solder balls to other adjacently stacked chip scale packages coupled by connecting boards.

12. A stack package including two or more area array type chip scale packages comprising:
    a lower chip scale package of an adjacent pair of chip scale packages, the lower chip scale package comprising a substrate, a plurality of ball land pads formed on a first surface of the substrate, circuit patterns terminating in a plurality of connecting pads formed outside an area in which the plurality of ball land pads are formed, wherein the circuit patterns and the plurality of connecting pads are formed on the first surface of the substrate and are electrically connected to the plurality of ball land pads, and a chip installed on a second surface of the substrate and electrically connected to the circuit patterns, wherein the second surface is opposite the first surface; and
    an upper chip scale package of the adjacent pair of chip scale packages, the upper chip scale package comprising a substrate, a plurality of ball land pads formed on a first surface of the substrate, circuit patterns terminating in a plurality of connecting pads formed outside an area in which the plurality of ball land pads are formed, wherein the circuit patterns and the plurality of connecting pads are formed on the first surface of the substrate and are electrically connected to the plurality of ball land pads, and a chip installed on a second surface of the substrate and electrically connected to the circuit patterns, wherein the second surface is opposite the first surface,
    wherein the upper chip scale package is stacked on the lower chip scale package so that the ball land pads of the upper chip scale package face a direction opposite that of the ball land pads of the lower chip scale package, and wherein the circuit patterns of the upper chip scale package are electrically connected to the circuit patterns of the lower chip scale package via one or more conductive vias.

13. The stack package of claim 12, wherein, for each chip scale package, the chip and the second surface of the substrate are covered by encapsulating parts, and wherein the conductive vias are formed through the encapsulating parts.

14. The stack package of claim 12, wherein, for each chip scale package, a hole is formed in the substrate and the chip is electrically connected to the circuit patterns by bonding wires through the hole.

15. The stack package of claim 14, wherein, for each chip scale package, a plurality of bonding pads are formed on the central region of the chip and are exposed through the hole, and wherein one end of each bonding wire is attached to a corresponding bonding pad of the chip.

16. The stack package according to claim 15, wherein, for each chip scale package, the chip is protected by a first encapsulating part, and the bonding pads and the bonding wires are protected by a second encapsulating part.

17. The stack package according to claim 16, wherein one of the adjacent pair of chip scale packages is attached to the other by an adhesive applied on the first encapsulating part.

18. The stack package according to claim 12, wherein a plurality of solder balls is formed on the ball land pads of the lower chip scale package.

19. The stack package according to claim 12, wherein a single chip scale package is stacked on and electrically connected through a plurality of solder balls to adjacently stacked chip scale packages coupled by conductive vias.

20. The stack package according to claim 12, wherein adjacently stacked chip scale packages coupled by conductive vias are stacked on and electrically connected through a plurality of solder balls to other adjacently stacked chip scale packages coupled by conductive vias.

* * * * *